US008564783B2

(12) United States Patent
Flanders et al.

(10) Patent No.: US 8,564,783 B2
(45) Date of Patent: Oct. 22, 2013

(54) OPTICAL COHERENCE TOMOGRAPHY LASER WITH INTEGRATED CLOCK

(75) Inventors: Dale C. Flanders, Lexington, MA (US); Walid A. Atia, Lexington, MA (US); Bartley C. Johnson, North Andover, MA (US); Mark E. Kuznetsov, Lexington, MA (US); Carlos R. Melendez, Dracut, MA (US)

(73) Assignee: Axsun Technologies, Inc., Billerica, MA (US)

( * ) Notice: Subject to any disclaimer, the term of this patent is extended or adjusted under 35 U.S.C. 154(b) by 455 days.

(21) Appl. No.: 12/396,099

(22) Filed: Mar. 2, 2009

(65) Prior Publication Data

US 2009/0290167 A1 Nov. 26, 2009

Related U.S. Application Data

(60) Provisional application No. 61/053,241, filed on May 15, 2008.

(51) Int. Cl.
*G01B 9/02* (2006.01)

(52) U.S. Cl.
USPC ........................................ 356/450

(58) Field of Classification Search
USPC .................................. 356/497, 450
See application file for complete search history.

(56) References Cited

U.S. PATENT DOCUMENTS

| 5,956,355 A * | 9/1999 | Swanson et al. ........ 372/20 |
| 7,099,358 B1 | 8/2006 | Chong |
| 7,355,721 B2 | 4/2008 | Quadling et al. |
| 7,415,049 B2 | 8/2008 | Flanders et al. |
| 7,542,145 B2 | 6/2009 | Toida et al. |
| 7,916,387 B2 | 3/2011 | Schmitt |
| 8,049,900 B2 | 11/2011 | Kemp et al. |
| 8,059,277 B2 | 11/2011 | Atia et al. |
| 8,259,167 B2 | 9/2012 | Ishiwata et al. |
| 8,267,572 B2 | 9/2012 | Windhab et al. |

(Continued)

FOREIGN PATENT DOCUMENTS

| JP | 2007-101249 A | 4/2007 |
| JP | 2007-260123 A | 10/2007 |

(Continued)

OTHER PUBLICATIONS

Huber, R., et al., "Amplified, frequency swept lasers for frequency domain reflectometry and OCT imaging: design and scaling principles," Optics Express, vol. 13, No. 9, May 2, 2005, pp. 3513-3528.

(Continued)

*Primary Examiner* — Michael A Lyons
*Assistant Examiner* — Jonathan Hansen
(74) *Attorney, Agent, or Firm* — Houston & Associates, LLP

(57) ABSTRACT

A frequency swept laser source for TEFD-OCT imaging includes an integrated clock subsystem on the optical bench with the laser source. The clock subsystem generates frequency clock signals as the optical signal is tuned over the scan band. Preferably the laser source further includes a cavity extender in its optical cavity between a tunable filter and gain medium to increase an optical distance between the tunable filter and the gain medium in order to control the location of laser intensity pattern noise. The laser also includes a fiber stub that allows for control over the cavity length while also controlling birefringence in the cavity.

23 Claims, 5 Drawing Sheets

(56) References Cited

U.S. PATENT DOCUMENTS

| | | |
|---|---|---|
| 2005/0083533 A1* | 4/2005 | Atia et al. .................... 356/454 |
| 2006/0029110 A1* | 2/2006 | Cho et al. ......................... 372/6 |
| 2006/0131488 A1* | 6/2006 | Thingbo et al. .......... 250/227.23 |
| 2006/0215713 A1 | 9/2006 | Flanders et al. |
| 2006/0279742 A1 | 12/2006 | Tearney et al. |
| 2008/0165366 A1* | 7/2008 | Schmitt ........................ 356/519 |
| 2009/0059970 A1 | 3/2009 | Atia et al. |

FOREIGN PATENT DOCUMENTS

| | | |
|---|---|---|
| JP | 2008-504049 A | 2/2008 |
| JP | 2008-545970 A | 12/2008 |
| JP | 2010-515919 A | 5/2010 |
| JP | 2010-533301 A | 10/2010 |
| WO | 2005/022709 A1 | 3/2005 |
| WO | 2006/021375 A1 | 3/2006 |
| WO | 2006/130802 A2 | 12/2006 |

OTHER PUBLICATIONS

International Preliminary Report on Patentability mailed Nov. 25, 2010, from International Application No. PCT/US2009/044173, filed on May 15, 2009.

Huber, R., et al., "High speed frequency swept light source for Fourier domain OCT at 20 kHz A-scan rate," Proceedings of SPIE, vol. 5690, No. 96, Apr. 19, 2005, pp. 96-100.

Partial Search Report dated Oct. 26, 2009, from counterpart International Application No. PCT/US2009/044173, filed on May 15, 2009.

* cited by examiner

OPTICAL COHERENCE TOMOGRAPHY LASER WITH INTEGRATED CLOCK

RELATED APPLICATIONS

This application claims the benefit under 35 USC 119(e) of U.S. Provisional Application No. 61/053,241, filed on May 15, 2008, which is incorporated herein by reference in its entirety.

BACKGROUND OF THE INVENTION

Optical coherence analysis relies on the use of the interference phenomena between a reference wave and an experimental wave or between two parts of an experimental wave to measure distances and thicknesses, and calculate indices of refraction of a sample. Optical Coherence Tomography (OCT) is one example technology that is used to perform usually high-resolution cross sectional imaging. It is often applied to imaging biological tissue structures, for example, on microscopic scales in real time. Optical waves are sent through an object or sample and a computer produces images of cross sections of the object by using information on how the waves are changed.

The original OCT imaging technique was time-domain OCT (TD-OCT), which used a movable reference mirror in a Michelson interferometer arrangement. Another type of optical coherence analysis is termed Fourier domain OCT (FD-OCT). Other related OCT techniques are time encoded and spectrum encoded Frequency Domain OCT. These Fourier domain techniques use either a wavelength swept source and a single detector, sometimes referred to as time-encoded FD-OCT or TEFD-OCT, or a broadband source and spectrally resolving detector system, sometimes referred to spectrum-encoded FD-OCT or SEFD-OCT. FD-OCT has advantages over time domain OCT (TD-OCT) in speed and signal-to-noise ratio (SNR).

TEFD-OCT has advantages over SEFD-OCT in some respects. The spectral components are not encoded by spatial separation, but they are encoded in time. The spectrum is either filtered or generated in successive frequency steps and reconstructed before Fourier-transformation. Using the frequency scanning light source (i.e. wavelength tuned laser) the optical configuration becomes less complex but the critical performance characteristics now reside in the wavelength tuned laser and especially its tuning speed and accuracy.

SUMMARY OF THE INVENTION

Frequency swept laser source for TEFD-OCT imaging requires tuning at very high repetition rates, in the tens of kilohertz, for fast real-time image frame acquisition with a sufficiently large image pixel count. At the same time, long coherence length of the source is required for large imaging depth ranges.

For high resolution/low noise imaging, swept laser OCT systems require either an extremely linear optical frequency sweep in time, or some mechanism to measure and compensate for nonlinear tuning.

Many OCT systems use a stand alone Fabry-Perot, Mach-Zehnder or some other type of fixed interferometer to provide frequency markers equally spaced in optical frequency to trigger digitization of the signal from the sample as the swept laser is tuned through its frequency scan band. These implementations are often done with fiber-optic components. The problem with these methods is cost in assembly labor, cost in components, and physical size.

In general, according to one aspect, the invention features a clock laser system comprising an optical bench, a tunable laser source, on the optical bench, that generates an optical signal that is tuned over a spectral scan band, and a clock subsystem on the optical bench that generates clock signals as the optical signal is tuned over the scan band.

In operation, a portion of the optical signal generated by the tunable laser is directed to the clock subsystem.

In the preferred embodiment, the tunable laser source comprises a front reflector, through which the optical signal is provided, and a back reflector, through which light generated in the tunable laser source is provided to the clock subsystem, wherein the front reflector and the back reflector define a laser cavity of the tunable laser source.

At least one lens component is typically used on the optical bench for collimating the optical signal from the tunable laser source and received by the clock subsystem.

In the current embodiment, the clock subsystem comprises an etalon for spectrally filtering the tunable signal, a detector for detecting the optical signal filtered by the etalon to produce the clock signals, and a beam splitter for directing a portion of the optical signal to the etalon and directing the filtered optical signal returning from the etalon to the detector.

In general, according to another aspect, the invention is characterized as a method for generating a clock signal for a tunable laser. The method comprises generating a tunable signal that is scanned over a spectral scan band in a tunable laser that is implemented at least in part on an optical bench, filtering a portion of light generated in the tunable signal to a filter installed on the optical bench, and generating clock signals from the light filtered by the filter with a detector installed on the bench. These clock signals indicate scanning of the tunable signal through fixed frequency increments.

Another problem that can arise in tunable lasers, and when tunable lasers are used in optical coherence systems, is noise from the lasers. Laser pattern noise can arise from parasitic reflections within the system and particularly the laser.

In general, according to another aspect, the invention features an optical coherence analysis system. This system comprises an interferometer for using an optical signal to analyze a sample and a tunable laser for generating the optical signal. The tunable laser includes a gain medium for amplifying optical signals within a laser cavity of the tunable laser, a tunable filter for tuning the optical signals over a spectral scan band, and a cavity extender in the optical cavity to increase an optical distance within the cavity. This extender has the effect of moving laser pattern noise to a region where it is less problematic for the optical coherence analysis system.

In the current embodiment, the cavity extender is located between the tunable filter and the gain medium to increase an optical distance within the laser cavity, more specifically, extending an optical distance between a lens component, which couples light between the tunable filter and the gain medium, and the tunable filter. Also, the cavity extender comprises a transparent substrate that is antireflection coated. Example materials include silica and silicon.

In general according to another aspect, the invention is characterized as a method for producing a tunable optical signal for an optical coherence analysis with reduced laser pattern noise. This method comprises generating the tunable optical signal in a laser cavity that comprises a train of optical elements: a gain medium, an intracavity tuning element, and at least one lens component for coupling light between the gain medium and the intracavity tuning element. The tunable optical signal is directed to an optical coherence analysis system. To address noise, a transmissive high refractive index component is inserted in the laser cavity to increase an optical distance between optical elements that produce spurious reflections.

In general according to another aspect, the invention features a sampling clock system for an optical coherence analysis system, comprising: an optical detector for detecting an optical clock signal generated by optically filtering a tunable signal from a tunable laser that generates light for the optical coherence analysis system and an electronic time delay circuit for delaying the signal from the optical detector by an amount corresponding to the propagation time of the light from the tunable laser in the optical coherence analysis system.

In the preferred embodiment, the electronic time delay circuit has a programmable delay. A high pass filter is also preferably provided for filtering the signal from the optical detector. Further, a frequency divider or multiplier is useful sometimes for decreasing or increasing a frequency of the signal from the optical detector.

Tunable lasers based on semiconductor gain media typically produce highly polarized light. It is further desirable to have a laser with a hybrid free space/fiber cavity, since the cavity length can be easily adapted to different optical coherence applications without necessitating a redesign. However, the use of the fiber can impact the tuning performance of the laser since it can introduce birefringence.

In general according to another aspect, the invention features a tunable laser for generating frequency tunable optical signals. The tunable laser includes a gain medium for amplifying optical signals within a laser cavity of the tunable laser, a tunable filter for tuning the optical signals over a spectral scan band, a fiber stub within the laser cavity between the gain medium and an end reflector of the laser cavity, and a fiber birefringence controller for changing a birefringence characteristics of the fiber stub. This is used to calibrate the laser to have the desired tuning characteristics.

Currently, the birefringence controller applies mechanical stress to the optical fiber by twisting the fiber.

In general according to another aspect, the invention is characterized as a method for calibrating an external cavity tunable laser having a hybrid free space and fiber cavity. The method comprises generating optical signals within a laser cavity of the tunable laser, tuning the optical signals over a spectral scan band, transmitting the optical signals between an end reflector of the laser cavity and the gain medium in an optical stub, changing the stress applied to the optical fiber until desired tuning characteristics are observed in the optical signal, and fixing the stress applied to the optical fiber.

Preferably, the stress applied to the optical fiber is changed to reduce polarization fading over the scan band of the tunable signal, to reduce changes in power as a function of frequency in the optical signal during tuning of the frequency of the optical signal, and/or to linearize changes in frequency as a function of time during tuning of the optical signal.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
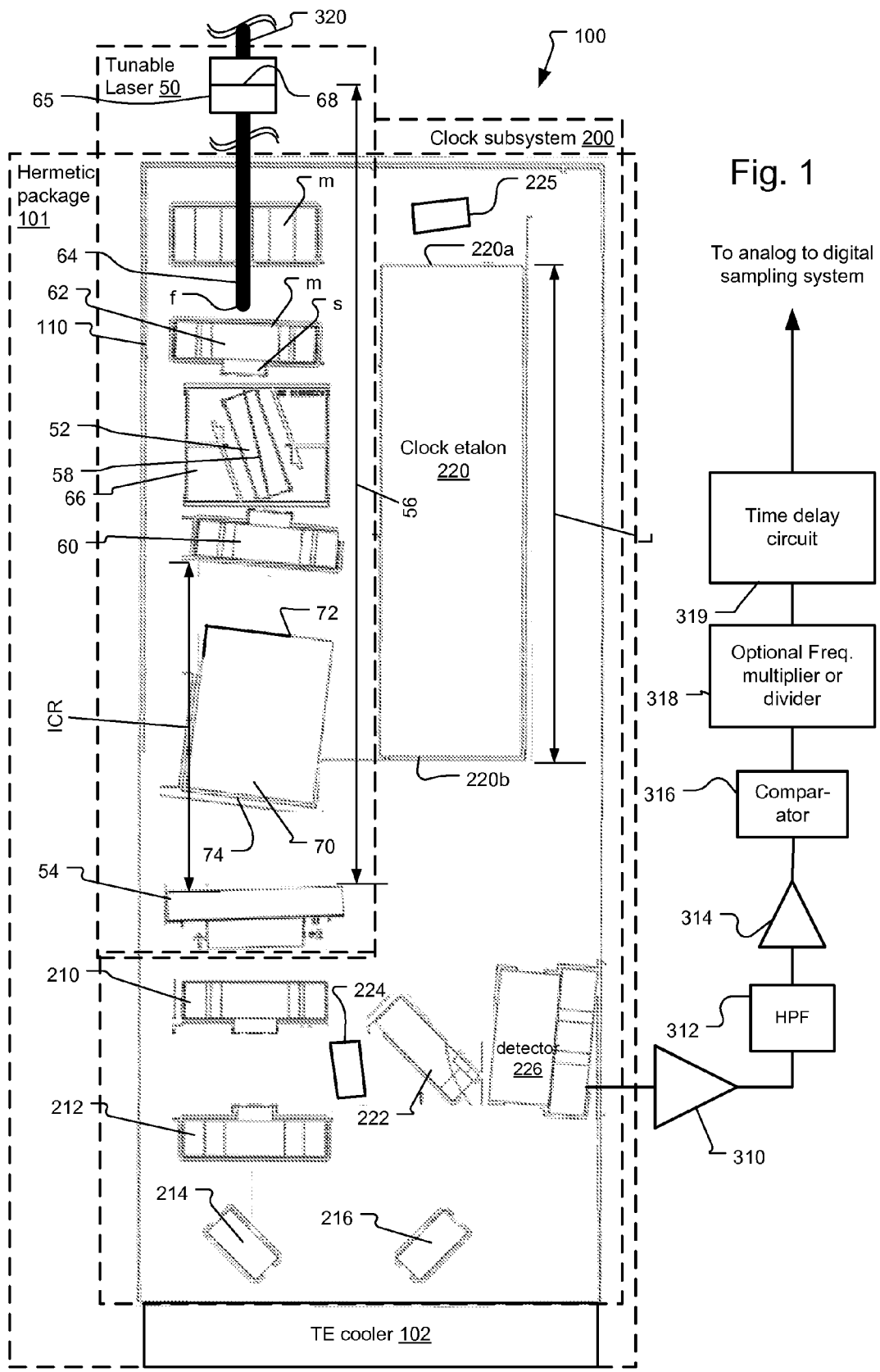
FIG. 1 is a scale plan view of a tunable laser with integrated clock.

FIG. 1 shows an integrated laser clock system 100 that has been constructed according to the principals of the present invention.

Generally the integrated laser clock system 100 comprises a tunable laser subsystem 50, which generates a wavelength or frequency tunable optical signal, and a clock subsystem 200, which generates clock signals at spaced frequency increments as the tunable signals or emissions of the laser 50 are spectrally tuned over a spectral scan band. The clock signals are used to trigger sampling, typically in an OCT system.

The tunable laser subsystem 50 and clock subsystem 200 of the integrated laser clock system 100 are integrated together on a common optical bench 110. This bench is termed a micro-optical bench and is preferably less than 10 millimeters (mm) by 20 mm in size so that it fits within a standard butterfly or DIP (dual inline pin) hermetic package 101. In one implementation, the bench is fabricated from aluminum nitride. A thermoelectric cooler 102 is disposed between the bench 110 and the package 101 (attached/solder bonded both to the backside of the bench and inner bottom panel of the package 101) to control the temperature of the bench 110.

In more detail, the tunable laser 50 in the preferred embodiment is based on the tunable laser designs disclosed in U.S. Pat. No. 7,415,049 B2, which is incorporated herein in its entirety by this reference.

In the current implementation, the tunable laser 50 comprises a semiconductor gain chip 52 that is paired with a micro-electro-mechanical (MEMS) angled reflective Fabry-Perot tunable filter 54 to create external cavity laser (ECL) with the tunable filter 54 being an intracavity tuning element and forming one end, or back reflector, of a laser cavity 56 of the tunable ECL 50.

The semiconductor optical amplifier (SOA) chip 52 is located within the laser cavity 56. In the current embodiment, both facets of the SOA chip 52 are angled relative to a ridge waveguide 58 running longitudinally along the chip 52 and anti-reflection (AR) coated, providing parallel beams from the two facets. The SOA chip 52 is mounted on a submount 66 that, in turn, is mounted on the top side of the optical bench 110, typically by solder bonding.

To collect and collimate the light exiting from each end facet of the SOA 52, two lens structures 60, 62 are used. Each lens structure 60, 62 comprises a LIGA mounting structure m, which is deformable to enable post installation alignment, and a transmissive substrate s in which the lens is formed. The transmissive substrate s is typically solder or thermocompression bonded to the mounting structure m, which in turn is solder bonded to the optical bench 110.

The first lens component 60 couples the light between the back facet of the SOA 52 and the tunable filter 54. Light exiting out the front facet of the SOA 52 is coupled by a second lens component 62 to optical fiber stub 64 via its front facet. The optical fiber stub 64 is also preferably solder attached to the optical bench 110 via a mounting structure m. The output optical fiber 64 is usually single spatial mode fiber (SMF).

The optical fiber 64 transports the tunable signal to a coupler 65. Here the optical fiber terminates in a reflective coating 68, for a front reflector of the laser cavity 56, having between 1 and 85 percent reflectivity to feedback a portion of the tunable signal into the laser cavity 56. The light transmitted through the reflective coating 68 is transported to the optical coherence analysis system 300, see FIG. 3, via fiber pigtail 320.

The use of the fiber stub 64 in the cavity yield an ECL that has hybrid free space and fiber cavity, with the free space portion being implemented on the optical bench. The use of the stub 64 provides for control over the length of the laser cavity 56 by adjusting the length of the stub without necessitating changes to the portion of the optical cavity implemented on the bench 110. Generally, the cavity length 56 of the laser is selected in dependence upon the desired tuning speed: too long a cavity/fiber stub 64 may prevent the laser from lasing due to the transit time of light from the amplifier to the fiber exceeding the tunable filter bandwidth dwell time during a scan; but too short a fiber cavity will contain too few longitudinal modes in the laser emission defined by the linewidth of the tunable filter and contribute to high relative intensity noise (RIN) and tuning instability. In the current embodiment, for scan speeds ranging from 10 kHz to 100 kHz, fiber lengths vary from 30 centimeters (cm) to 3 cm.

The angled reflective Fabry-Perot filter 54 is a multi-spatial-mode tunable filter having a curved-flat optical resonant cavity that provides angular-dependent, reflective spectral response back into the laser cavity 56. This effect is discussed in more detail in incorporated U.S. Pat. No. 7,415,049 B2. In the referred embodiment, the curved mirror is on the MEMS membrane and is on the side of the filter 54 that adjoins the laser cavity 56. The flat mirror is on the opposite side and faces the laser cavity 56. The flat mirror preferably has a higher reflectivity than the curved mirror. Currently the reflectivities for the flat and curved mirrors are typically 99.98% and 99.91%, respectively, in order to achieve the desired reflectivity and requisite linewidth of the filter 54 in reflection.

The light transmitted by the tunable filter 54 is coupled out of the laser cavity 56 and into the clock subsystem 200 to be collimated by a third lens component 210 and a fourth lens component 212, which are solder bonded to the optical bench 110. Two fold mirrors 214 and 216, which are reflective coated substrates that are solder bonded to the bench 110, fold the beam of the light from the tunable laser subsystem 50, allowing for a dimensionally compact system.

The light then passes through a beam splitter 222, which is preferably a 50/50 splitter to a clock etalon 220. Any light reflected by the splitter 222 is directed to a beam dump component 224 that absorbs the light and prevents parasitic reflections in the hermetic package 101 and into the laser cavity 56.

The clock etalon 220 functions as a spectral filter. Its spectral features are periodic in frequency and spaced spectrally by a frequency increment related to the refractive index of the constituent material of the clock etalon 220, which is fused silica in one example, and the physical length L of the clock etalon 220. The etalon can alternatively be made of other high-index and transmissive materials such as silicon for compactness, but the optical dispersion of the material may need to be compensated for with additional processing inside the DSP. Also, air-gap etalons, which are nearly dispersionless, are another alternative.

The contrast of the spectral features of the etalon is determined by the reflectivity of its opposed endfaces 220a, 220b. In one example, reflectivity at the etalon endfaces 220a, 220b is provided by the index of refraction discontinuity between the constituent material of the etalon and the surrounding gas or vacuum. In other examples, the opposed endfaces 220a, 220b are coated with metal or preferably dielectric stack mirrors to provide higher reflectivity and thus contrast to the periodic spectral features.

Figure 2:
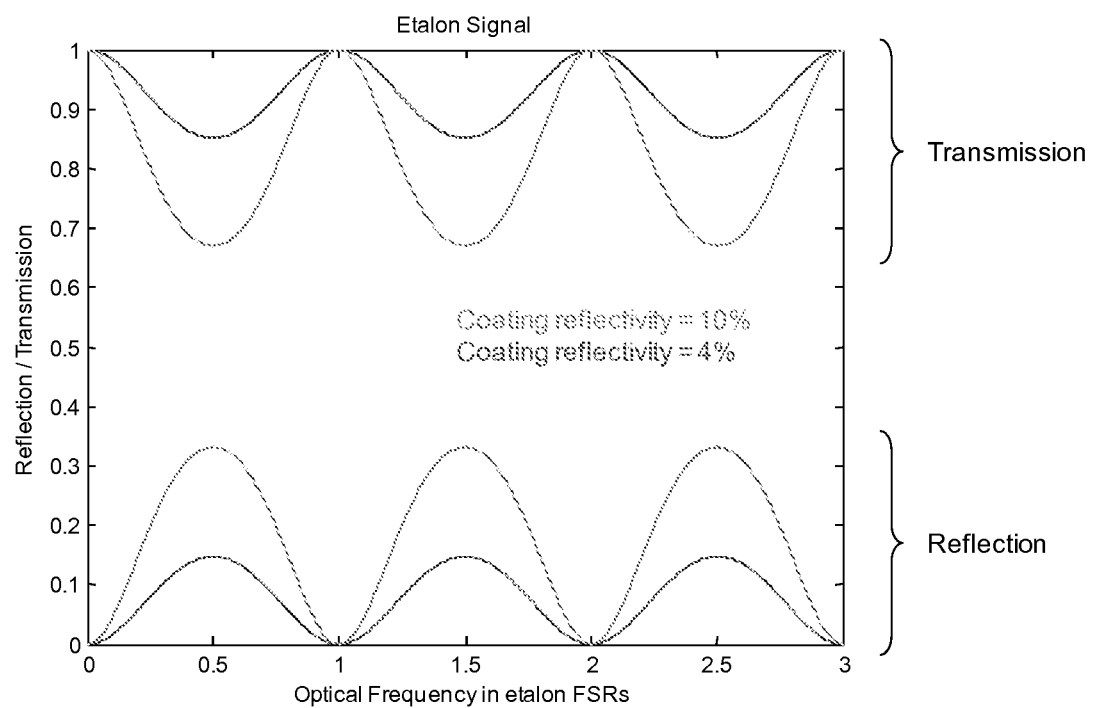
FIG. 2 is a plot of transmission and reflection for the clock etalon.

In the illustrated example, the clock etalon 220 is operated in reflection. FIG. 2 is a plot of reflection/transmission as a function of optical frequency in units of the free spectral range (FSR) of the etalon 220. Thus, as the light from the laser scans through reflection peaks and troughs located at the fixed frequency increments, a clock signal is formed indicating each time the laser has scanned through another frequency increment.

The FSR of the clock etalon is chosen based on the required scanning depth in an OCT system. The Nyquist criterion dictates that the periodic frequency spacing of the clock etalon that defines the sample rate be half the smallest frequency period component of the sample, thus setting the optical thickness of the clock etalon to twice the required imaging depth. However, as is typically done with clock oscillators, the periodic waveform can be electrically frequency doubled, tripled, etc, or can be halved to obtain the desired sample rate while choosing an etalon of a length that is convenient for handling and that easily fits within the package 101 and on the bench 110. A thicker etalon compensates better for nonlinear frequency scanning than a thinner one due to its finer sample rate, but it is larger and more difficult to fabricate, so a tradeoff is made depending upon the laser tuning linearity, system depth requirements, and manufacturing tolerances. Moreover, a thicker etalon requires a laser of comparable coherence length to generate stable clock pulses, so the laser coherence length can also help dictate the design of the etalon thickness.

Returning to FIG. 1, the light returning from the clock etalon 220 and reflected by beamsplitter 222 is detected by detector 226. The light detected by detector 226 is characterized by drops and rises in power as the frequency of the tunable signal scans through the reflective troughs/reflective peaks provided by the clock etalon 220.

The detector photocurrent is amplified with a transimpedance amplifier 310. Its signal is sent through a high-pass filter 312 to remove the direct current (DC) and other low-frequency components. The object of this processing is to provide an oscillating signal centered about zero Volts where the zero-crossings can be detected to generate a precise clock signal. Further shaping of the clock is provided by an amplifier 314, which can be a linear type, an automatic gain control type, or a limiting type amplifier. The amplifier 314 is followed by an optional fast comparator 316 to detect zero crossings and convert the analog signal to a clean digital clock signal. The clock signal is multiplied or divided in frequency by multiplier/divider 318, depending on the needs of the OCT system's application and the requirement for a convenient etalon (or other clock interferometer) size within the butterfly package 101.

In one embodiment, a frequency multiplier 318 is used to increase the sampling frequency to the multiple of the signal from the clocking detector. This is used in situations in which a higher sampling frequency is required. One case where it is advantageous is for applications that require a very deep scan range. For example, if a scan range of L is required, the etalon length would have to be at least 2 L/n, where n is the refractive index. By installing frequency doubling electronics, the etalon length would only have to be L/n. This may make the difference between an etalon that fits inside the package and not. Another reason for using multiplication electronics is that it can increase stability of the clock signal for a given laser coherence length. The interference fringes are more stable for shorter etalon lengths. It is typically the case that clocks from a shorter etalon, but later frequency multiplied, are more stable overall. Alternatively, using a shorter clocking etalon with electronic frequency multiplication allows using a laser with a smaller coherence length while maintaining good clock stability.

Light that is transmitted through the etalon is absorbed by a second beam dump component 225 that absorbs the light and prevents parasitic reflections into the laser cavity. The transmission signal through etalon 220 can alternatively be used as a marker. In this implementation, the detector is placed in the position of the beam dump 225. Currently, the reflection signal is preferred because of its low DC offset (higher contrast signal).

Figure 3:
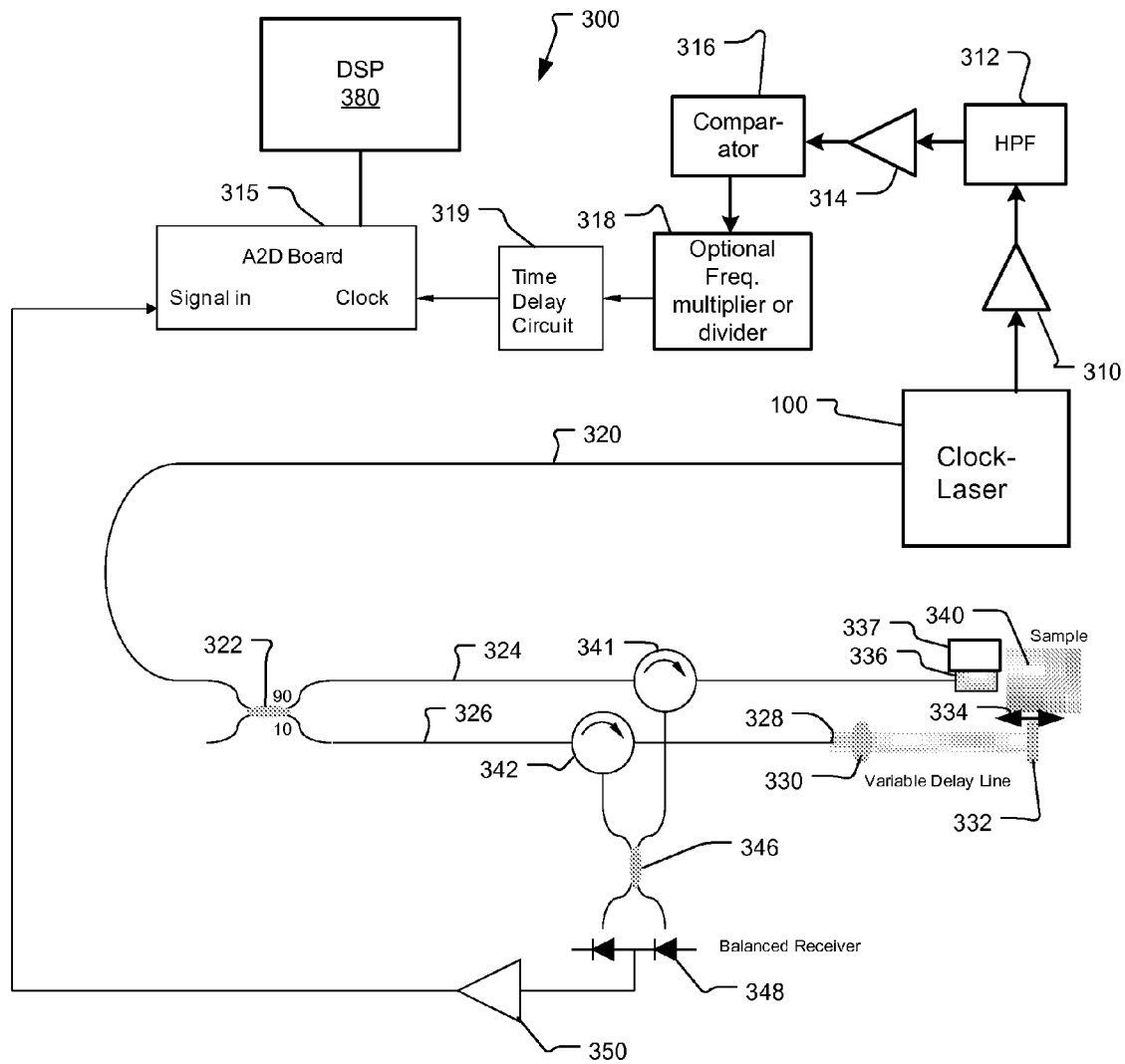
FIG. 3 is a schematic block diagram of an optical coherence analysis system.

FIG. 3 shows an example of how the laser/clock module 100 of FIG. 1 is used in one, exemplary optical coherence analysis system 300, and more specifically the Michelson interferometer that is used to analyze the optical signals from the sample. Many other OCT system interferometer configurations and sample probe optics can be used with the laser/clock module 100, however.

In more detail, the illustrated system is a time encoded Fourier domain optical coherence tomography system (TEFD-OCT). The light from the tunable laser 50 is output on fiber 320 to a 90/10 optical coupler 322. The tunable signal is divided by the coupler 322 between a reference arm 326 and a sample arm 324 of the system.

The optical fiber of the reference arm 326 terminates at the fiber endface 328. The light exiting from the reference arm fiber endface 328 is collimated by a lens 330 and then reflected on a mirror 332 to return back. It is then directed by circulator 342 to 50/50 fiber coupler 346.

The external mirror 332 has an adjustable fiber to mirror distance (see arrow 334). This distance determines the depth range being imaged, i.e. the position in the sample 340 of the zero path length difference between the reference arm 326 and the sample arm 324. The distance is adjusted for different sampling probes and/or imaged samples. Light returning from the reference mirror 332 is returned to a reference arm circulator 342 and directed to the 50/50 fiber coupler 346.

The fiber on the sample arm 324 terminates at the sample arm probe 336. The exiting light is focused by the probe 336 onto the sample 340. Light returning from the sample 340 is returned to a sample arm circulator 341 and directed to the 50/50 fiber coupler 346. The reference arm signal and the sample arm signal are combined in the fiber coupler 346. The combined signal is detected by a balanced receiver, comprising two detectors 348, at each of the outputs of the fiber coupler 346.

In examples, the scanning is implemented by moving the probe 336 relative to the sample 340 using a two (x-y) dimensional or three (x-y-z) dimensional positioner 337. In other examples, the x-y-z scanning is implemented by moving the sample 340 relative to the probe 336. In still other examples, cylindrical scanning is implemented by rotating and axially moving the probe 336.

The clock signal is produced by the clock subsystem 200 of the clock laser 100, and is further formed and conditioned by the transimpedance amplifier 310, high-pass filter 312, amplifier 314, optional fast comparator 316, and optional multiplier/divider 318 as described previously.

A programmable time delay circuit 319 is also provided. This delays the sampling/clock signal by a period determined by a user or electronically by DSP 380. The delay is selected so that the clock signal is aligned in time with the optical signals detected by the balanced detectors 348 of the OCT system and amplified by amplifier 350. Specifically the time delay delays the clock signals for a time corresponding to the delay associated with the optical signals propagation through the optical fibers in the interferometer arms.

The main interferometer in an OCT system typically has long lengths of fiber in it, causing long time delays. The clock, however, does not suffer these delays because it is very close to the laser. It is essential that delay mismatch be minimized for highest OCT system performance, especially in terms of resolution. Since the delay mismatch cannot be made up optically in a compact system, an electronic delay line is useful. The electronic delay is set to match the delay of the OCT system and is programmable in a system designed for flexibility.

An analog to digital converter system 315 is used to sample the output from the amplifier 350. The clock input from the clock subsystem provides time of the sampling at equally spaced swept optical frequency increments.

Once a complete data set has been collected from the sample 340 by the operation of the scanner and the spectral response at each one of these points is generated from the tuning of the laser-laser clock module 100, the digital signal processor 380 performs a Fourier transform on the data in order to reconstruct the image and perform a 2D or 3D tomographic reconstruction of the sample 340. This information generated by the digital signal processor 380 is then displayed on a video monitor.

Cavity Extender

Parasitic reflections in the laser cavity give rise to laser pattern intensity noise, or laser intensity variation as the laser is tuned. This manifests itself as artifacts in the reconstructed images, appearing as spurious features at intra-sample positions corresponding to the laser intracavity distances between parasitic reflections. In the embodiment illustrated in FIG. 1, a major contributor to these artifacts is the parasitic reflections between tunable filter 54 and the lens structure 60. The distance between these two reflectors, ICR, give rise to laser pattern noise at the equivalent optical distance with the sample 340. This is especially problematic when the optical distance ICR corresponds to optical distance of interest within the sample 340.

Figure 4A:
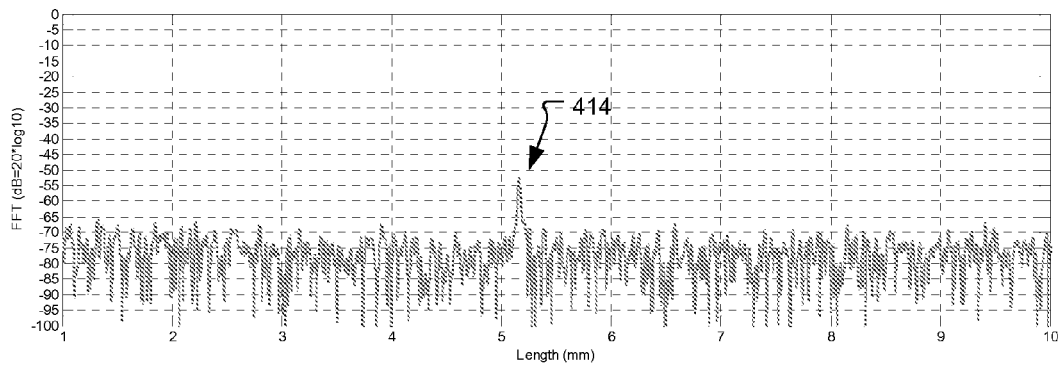
FIG. 4A is a plot of laser intensity pattern noise as function of optical path lengths within the sample showing a spurious noise peak located at about 5.1 millimeters (mm) sample depth.

FIG. 4A is a plot of laser pattern noise as a function of optical distance or depth, for example within the sample. Here optical distance means the equivalent physical distance in an air or vacuum. Thus the corresponding physical distance is scaled by the refractive index of the transmission media, such as the sample. Artifact generated by peak 414 corresponding to the reflection between the tunable filter 54 and lens structure 60 is problematic if the sample distance overlaps this peak. One way to solve this potential problem is to reduce the magnitude of the spurious reflections and thus the magnitude of the spurious peak 414. However, sufficient reduction of the peak magnitude is not always possible. Another possible approach is to move this spurious peak to an optical distance location which is outside of the imaging range of interest. In this case the peak either does not appear at all inside the frame of the image, which can excise the undesired depth region, or, if the peak is folded into the image by aliasing from signal sampling, the peak can be sufficiently attenuated by the sampling anti-aliasing filter in the system. Moving the spurious peak to a different location requires changing optical distance between the two components producing the interference of their reflections. Sometime moving these component positions might be sufficient. However, the filter position might be fixed in order for the lens to mode-match the beam size from the semiconductor optical amplifier to the filter mode size using the lens. What is desired is a method to maintain mode-matching while extending the optical path length between the filter and the lens.

FIG. 1 shows a tunable laser with an optical path length extender element 70 inside the laser cavity 56. In the preferred embodiment, the extender element 70 is a transparent high refractive index material, such as fused silica or silicon or other transmissive material having a refractive index of about 2 or higher. Currently silicon is used. Both endfaces 72, 74 of the extender element 70 are antireflection coated. Further, the element is preferably angled by between 1 and 10 degrees relative to the optical axis of the tunable laser 50 to further spoil any reflections from the its endfaces 72, 74 from entering into the laser beam optical axis. This extender element is placed between the two interfering reflectors 54 and 60 that cause the spurious peak 414, and the purpose of this extender element 70 is to change the optical distance between the two reflectors and thus change the length position of the spurious peak while not necessarily necessitating a change in the physical distance between the elements.

Since silicon has a refractive index of about 3.5 for relevant optical wavelengths, the extender element 70 has the effect of moving the noise peak 414 in FIG. 4A to the right to correspond to greater depths within the sample 340 so that the laser pattern noise is now outside the depth of interest within the sample 340

Figure 4B:
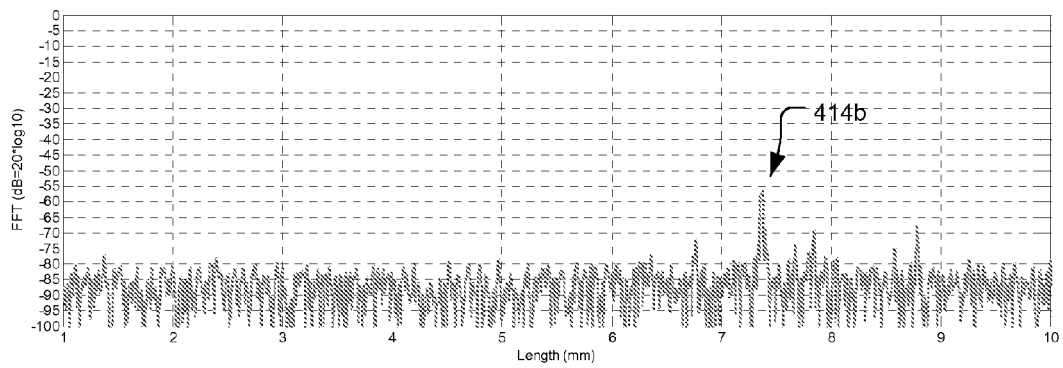
FIG. 4B is a plot of laser intensity pattern noise as function of optical path lengths within the sample showing a spurious noise peak moved to about 7.8 mm sample depth by operation of an optical path length extender element inside the laser cavity.

FIG. 4B is a plot of laser intensity pattern noise as a function of optical path lengths with the new position of the spurious noise peak at 414b due to the operation of the extender 70. Furthermore, the high index of the silicon reduces the beam divergence and thus permits the filter to be moved farther away from the lens and still remain mode-matched.

Figure 4C:
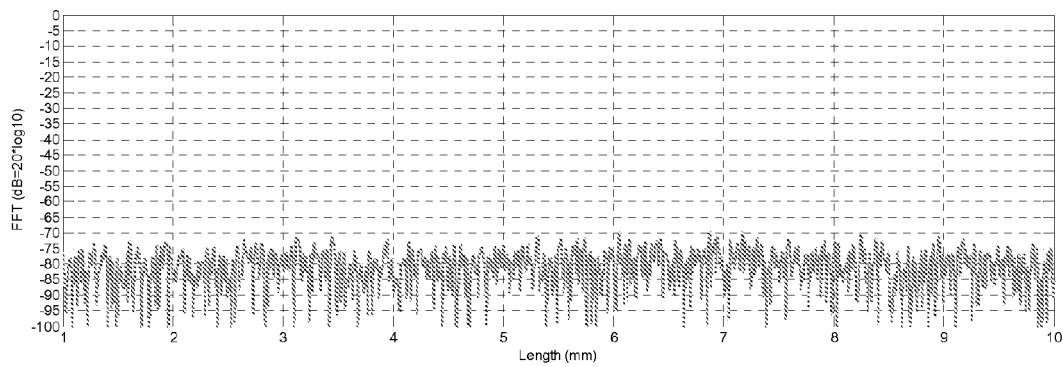
FIG. 4C is a plot of laser intensity pattern noise as function of optical path lengths within the sample showing a spurious noise peak moved beyond 10 mm sample depth by operation of an optical path length extender element inside the laser cavity.

Alternatively, the extender element 70 can be chosen to place the laser pattern beyond the imaging depth of the system such that the pattern folds over into the image, but the anti-aliasing filter reduces the pattern magnitude to a negligible level, as shown in FIG. 4C.

In a current embodiment, the distance ICR is about 10 millimeters and the length of the extender element is about 2 millimeters.

Intracavity Birefringence Control

Typically, the semiconductor optical amplifier (SOA) 52 has gain in only one preferential polarization direction. As described previously, light reflected from the fiber mirror coating 68 in the coupler 65 serves as one mirror of the laser cavity. However, single-mode fiber (non polarization-maintaining), which is often preferred for OCT applications (po- larization maintaining (PM) fiber can cause ghost images due to some light coupling into the undesired fiber axis and experiencing a longer time delay), can arbitrarily rotate the polarization state of the light (called birefringence) and thus degrade laser feedback over the tuning range. Further, stress from soldering the fiber further induces birefringence. In the worst-case instance, it can prevent lasing if the reflected light's direction of polarization ends up orthogonal to the preferred polarization state of the optical amplifier 52.

Figure 5:
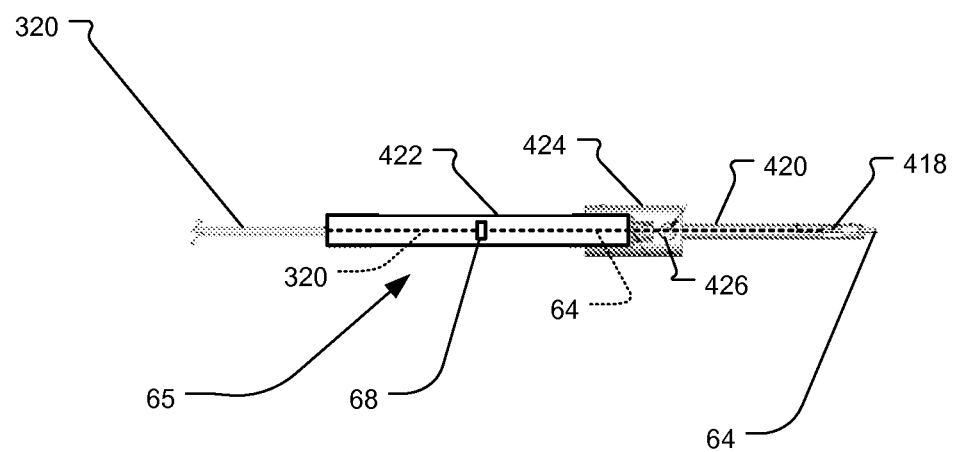
FIG. 5 is a plan view of an optical coupler providing intracavity birefringence control for the tunable laser.

Inserting a fiber polarization controller in the laser cavity 56 compensates by properly aligning the polarization state of the reflected light, but requires a long length of fiber and thus will not work with short fiber cavity lasers that are required for higher speed tuning. What is desired for a short fiber cavity (from 3 to 8 cm) is a device that allows for polarization alignment and fiber stability in a compact fixture, as shown in FIG. 5 and described below.

The fiber stub 64 is held by two points in the coupler 65: 1) solder at point 418 connects fiber 64 to tube 420 that is the coupler's ferrule; and 2) by the mechanical splice between fiber 64 and fiber 320 at the optical coating/laser end reflector 68.

One example of a mechanical splice is the 3M™ Fibrlok™ II Universal Optical Fiber Splice, which is mechanical splice that allows the coupling the highly reflective (HR) coated fiber 64 to the output fiber 320. In other examples, a fusion splice with an HR coating is used to couple fiber 64 to fiber 320.

This mechanical splice is fixed within the body 422 typically by an epoxy bond. A cylindrical holder 424 is fixed to the body 422 and has in inner bore into which the tube 420 is inserted. A set screw 426 enables the tube 420 to be rotated relative to the cylindrical holder 424 and then fixed to the holder 424 when the set screw 426 is tightened down. This allows a mechanical stress to be imparted to fiber 64 in its length between solder 418 and the region of the splice 68 that is secured to body 422. This stress affects the birefringence of the fiber 64 and thus affects the polarization state of the light within the laser cavity 56.

In operation and typically in a manufacturing/calibration stage, with the set screw 426 loosened, an operator twists the fiber 64 by rotating the body 422 about the stainless steel tube 420. The output of the tunable laser operation is monitored by a detector connected to a high speed oscilloscope. Twisting of the fiber stub 64 induces polarization changes. When optimal operation is observed, characterized by a maximum power output from the laser 100 and smooth tuning, i.e., reduced changes in power as a function of frequency during tuning and the change in frequency as a function of time is linear or near linear during tuning, over the desired tuning range without any polarization fading, the set screw 426 is tightened to fix the stress applied to the fiber. The stainless steel tube 420 prevents any subsequent fiber movement and thus maintains polarization stability.

Fiber 64 is single mode fiber. Because of bends in it and possibly stress at various points along its length, such as soldering points on the bench LIGA m and tube ferrule 420, it has some small amount of resulting birefringence. This means that the light sent into the fiber from the gain chip 52 and bench 110 does not come back from the fiber-end mirror 68 necessarily in the same polarization as it was launched. By fixing the fiber 64 in this coupler 65, and rotating slightly the fiber, the polarization of the light returning from the mirror 68 is matched to the launch polarization. This polarization matching occurs over the whole wavelength tuning range of the laser 100. Any residual birefringence of the SMF fiber is small.

While this invention has been particularly shown and described with references to preferred embodiments thereof, it will be understood by those skilled in the art that various changes in form and details may be made therein without departing from the scope of the invention encompassed by the appended claims.

What is claimed is:

1. A system comprising:
   an optical bench;
   a tunable laser source, on the optical bench, that generates an optical signal that is tuned over a spectral scan band;
   a clock subsystem on the optical bench that generates clock signals as the optical signal is tuned over the scan band;
   an interferometer that receives the optical signal and generates a combined signal based on the optical signal; and
   an analog to digital converter system that samples the combined signal in response to the clock signals;
   wherein the optical signal from a laser cavity of the tunable laser source and sent to the clock subsystem is taken after being filtered by a tunable filter in the laser cavity but prior to amplification by a gain chip in the laser cavity.

2. A system as claimed in claim 1, wherein a portion of the optical signal generated by the tunable laser is directed to the clock subsystem.

3. A system as claimed in claim 1, wherein the tunable laser source comprises a front reflector, through which the optical signal is provided, and a back reflector, through which light generated in the tunable laser source is provided to the clock subsystem, wherein the front reflector and the back reflector define the laser cavity of the tunable laser source.

4. A system as claimed in claim 1, further comprising at least one lens component on the optical bench for collimating the optical signal from the tunable laser source and received by the clock subsystem.

5. A system as claimed in claim 1, wherein the clock subsystem comprises:
   an optical filter for spectrally filtering the tunable optical signal; and
   a detector for detecting the optical signal filtered by the optical filter.

6. A system as claimed in claim 1, wherein the clock subsystem comprises:
   an etalon for spectrally filtering the tunable optical signal;
   a detector for detecting the optical signal filtered by the etalon to produce the clock signals; and
   a beam splitter for directing a portion of the optical signal to the etalon and directing the filtered optical signal returning from the etalon to the detector.

7. A system as claimed in claim 1, further comprising an electrical delay circuit for delaying the clock signals received by the analog to digital converter system by an amount corresponding to a delay of optical signals in the interferometer.

8. A system as claimed in claim 1, further comprising a frequency multiplier for increasing a clock rate of the clock signals received by the analog to digital converter system in response to the clock signals produced by the clock subsystem.

9. A system as claimed in claim 1, further comprising an electrical delay circuit for delaying the clock signals received by the analog to digital converter system by an amount to enable the clock signals to be aligned in time with the combined signal from the interferometer.

10. A system as claimed in claim 1, further comprising a comparator for detecting zero crossing to clean the clock signals.

11. A system as claimed in claim 1, further comprising a hermetic package, in which the optical bench is installed.

12. A system as claimed in claim 11, further comprising a temperature controller for controlling the temperature of the optical bench.

13. A system as claimed in claim 12, wherein the temperature controller is a thermoelectric cooler.

14. A system as claimed in claim 13, wherein the thermoelectric cooler is installed within the hermetic package.

15. A system as claimed in claim 1, wherein the optical signal from the laser cavity of the tunable laser source and sent to the interferometer is taken after amplification by the gain chip in the laser cavity but prior to being filtered by the tunable filter in the laser cavity.

16. A method for generating and using a clock signal for a tunable laser, the method comprising:
   generating a tunable signal that is scanned over a spectral scan band in a tunable laser that is implemented at least in part on an optical bench;
   extracting the tunable signal from a laser cavity of the tunable laser for a clock subsystem after being filtered by a tunable filter in a laser cavity of the tunable laser but prior to amplification by a gain chip in the laser cavity;
   filtering light of the tunable signal with a filter of the clock subsystem, which filter is installed on the optical bench;
   generating clock signals from the light filtered by the filter with a detector installed on the bench, the clock signals indicating scanning of the tunable signal through fixed frequency increments;
   transmitting the tunable signal to an interferometer that generates a combined signal based on the tunable signal; and
   sampling the combined signal in response to the clock signals.

17. A method as claimed in claim 16, further comprising providing the tunable laser source with a front reflector, through which the tunable-signal is provided to the interferometer, and a back reflector, through which the light of the tunable signal generated in the tunable laser source is provided to the clock subsystem, wherein the front reflector and the back reflector define the laser cavity of the tunable laser.

18. A method as claimed in claim 16, further comprising collimating the light of tunable signal from the tunable laser and received by the clock subsystem.

19. A method as claimed in claim 16, further comprising providing the clock subsystem with an etalon for spectrally filtering the tunable optical signal, a detector for detecting the optical signal filtered by the etalon to produce the clock signals and a beam splitter for directing a portion of the optical signal to the etalon and directing the filtered optical signal returning from the etalon to the detector.

20. A method as claimed in claim 16, further comprising delaying the clock signals received by the analog to digital converter system by an amount corresponding to a delay of optical signals in the interferometer.

21. A method as claimed in claim 16, further comprising delaying the clock signals received by the analog to digital converter system by an amount to enable the clock signals to be aligned in time with the combined signal from the interferometer.

22. A method as claimed in claim 16, further comprising increasing a clock rate of the clock signals received by the analog to digital converter system in response to the clock signals produced by the clock subsystem.

23. A method as claimed in claim 16, further comprising extracting the tunable signal from the laser cavity of the tunable laser and sending the tunable signal to the interferometer after amplification by the gain chip in the laser cavity but prior to being filtered by the tunable filter in the laser cavity.

* * * * *